United States Patent [19]

Tuntasood et al.

[11] Patent Number: 4,727,046

[45] Date of Patent: Feb. 23, 1988

[54] METHOD OF FABRICATING HIGH PERFORMANCE BICMOS STRUCTURES HAVING POLY EMITTERS AND SILICIDED BASES

[75] Inventors: Prateep Tuntasood, San Jose; Juliana Manoliu, Palo Alto, both of Calif.

[73] Assignee: Fairchild Semiconductor Corporation, Cupertino, Calif.

[21] Appl. No.: 887,007

[22] Filed: Jul. 16, 1986

[51] Int. Cl.⁴ .................. H01L 29/72; H01L 27/04
[52] U.S. Cl. ........................ 437/54; 437/31; 437/57; 437/41; 437/233; 156/653; 156/657; 357/43; 357/59
[58] Field of Search ............ 357/59 H, 43, 34; 29/571, 591, 578, 577 C; 148/DIG. 9; 156/653, 657; 148/187, 1.5, DIG. 11

[56] References Cited

U.S. PATENT DOCUMENTS

| | | |
|---|---|---|
| 3,955,269 | 5/1976 | Magdo et al. |
| 4,016,596 | 4/1977 | Magdo et al. |
| 4,050,965 | 9/1977 | Ipri et al. |
| 4,299,024 | 11/1981 | Piotrowski |
| 4,346,512 | 8/1982 | Liang et al. |
| 4,475,279 | 10/1984 | Gahle ............ 29/577 C |
| 4,477,965 | 10/1984 | Blossfeld ........ 29/577 C |
| 4,484,388 | 11/1984 | Iwasaki |
| 4,486,942 | 12/1984 | Hirao ............ 29/577 C |
| 4,507,847 | 4/1985 | Sullivan |
| 4,529,456 | 7/1985 | Anzai et al. |
| 4,536,945 | 8/1985 | Gray et al. |
| 4,547,791 | 10/1985 | Roger et al. |

FOREIGN PATENT DOCUMENTS 2143082 1/1985 United Kingdom .

OTHER PUBLICATIONS

Y. Okada et al., "An Advanced Bipolar-MOS-I²L Technology with a Thin Epitaxial Layer for Analog-Digital VLSI," *IEEE Transactions on Electron Devices* (1985), ED-32(2):232-236.

Y. Nishio et al., "A Subnanosecond Low Power Advanced Bipolar—CMOS Gate Array," *Proceedings of the IEEE International Conference on Computer Design* (1984), pp. 428-433.

A. R. Alvarez et al., "2 Micron Merged Bipolar-CMOS Technology," *International Electron Devices Meeting, Technical Digest* (1984), pp. 761-764.

F. Walczyk et al., "A Merged CMOS/Bipolar VLSI Process," *International Electron Devices Meeting, Technical Digest* (1983), pp. 59-62.

Abstracts of technical articles referencing both bipolar and CMOS transistors.

Abstracts on non-U.S. patents referencing both bipolar and CMOS transistors.

F. Rausch et al., "An Analog BIMOS Technology," *Extended Abstracts of the 18th Conference on Solid State Devices and Materials,* Tokyo, 1986, pp. 65-68.

K. Ogiue et al., "A 13ns/500mW 64Kb ECL RAM," 1986 IEEE International Solid-State Circuits Conference, *Digest of Technical Papers,* pp. 212-213, 353.

J. Manoliu et al., "High-Density and Reduced Latchup Susceptibility CMOS Technology for VLSI," *IEEE Electron Device Letters* (1983), EDL-R(7):233-235.

F. Rausch et al., "An Analog BIMOS Technology," 18th (1986 International) Conference on Solid State Devices and Materials, Tokyo, pp. 65-68.

*Primary Examiner*—Brian E. Hearn
*Assistant Examiner*—Kevin McAndrews
*Attorney, Agent, or Firm*—David H. Carroll; Lee Patch; Robert C. Colwell

[57] ABSTRACT

A process is disclosed for simultaneously fabricating bipolar and complementary field effect transistors. The process enables distinguishing the bipolar devices from the CMOS devices with a single base mask 108, while requiring only a single additional mask 114 to define the bipolar emitter and MOS gates. The process forms the gate oxide 100 for the MOS devices at an early stage, then protects that oxide with polysilicon 103 during subsequent fabrication steps. Self-aligned metal silicide contacts 137 are separated from undesired regions using sidewall oxidation techniques.

21 Claims, 14 Drawing Figures

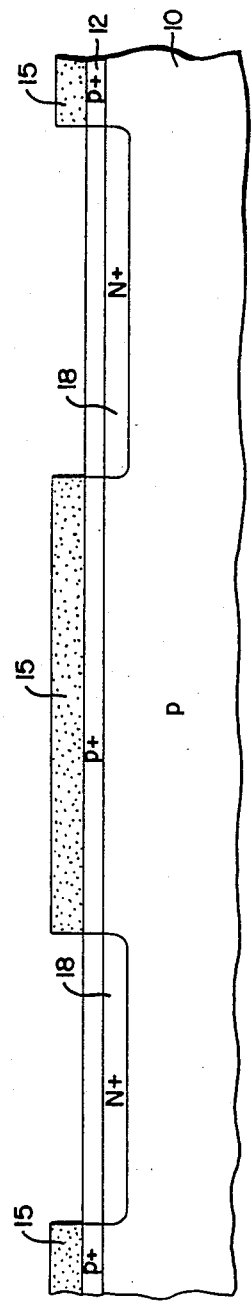
FIG._1.
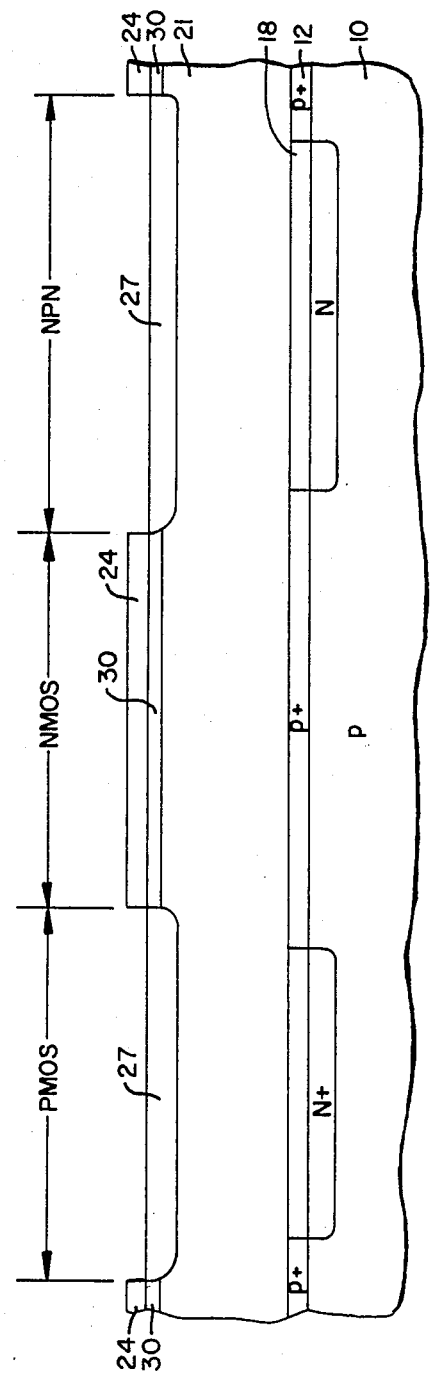
FIG._2.

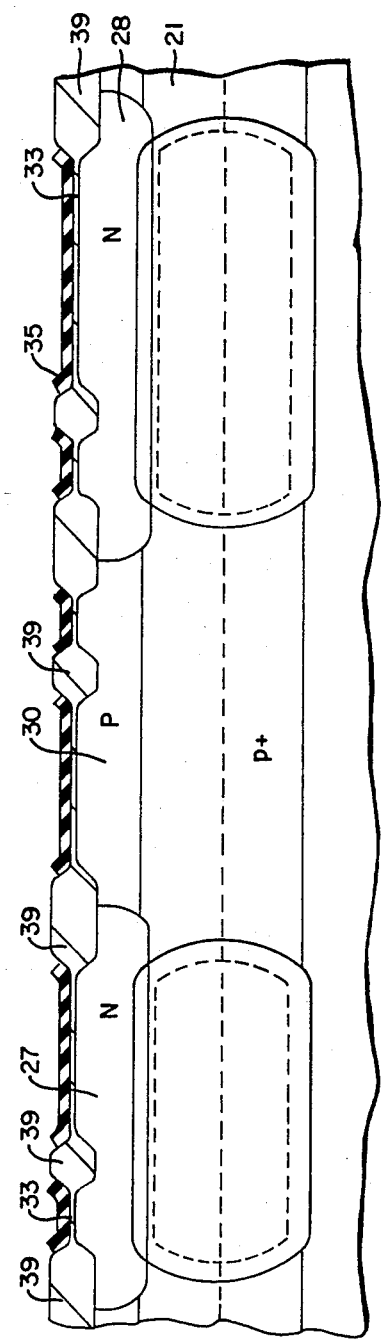
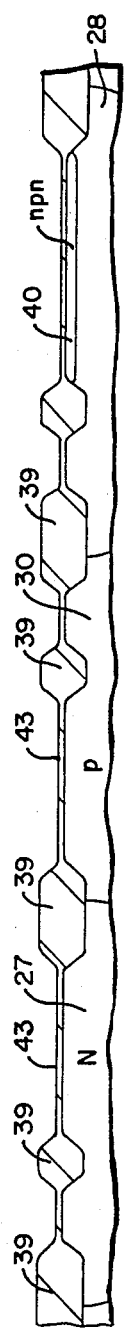
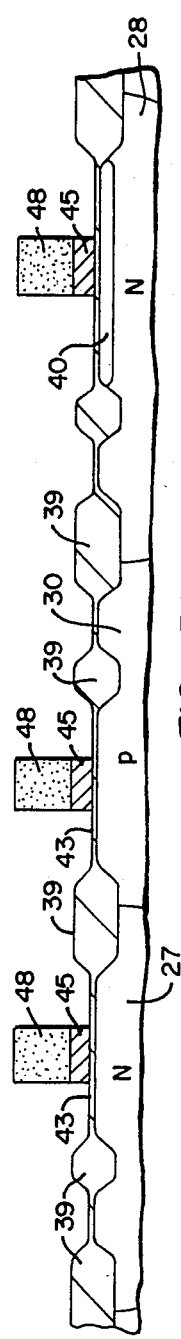
FIG._3.
FIG._4.
FIG._5.

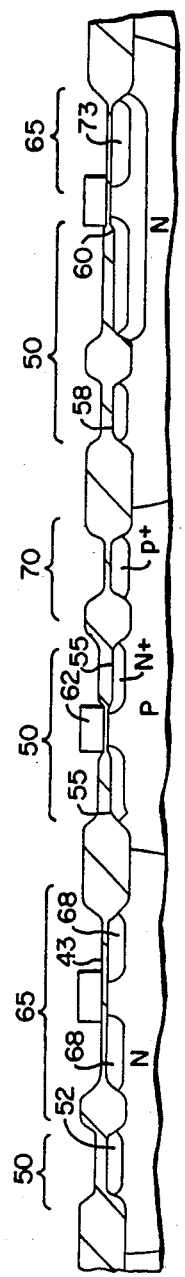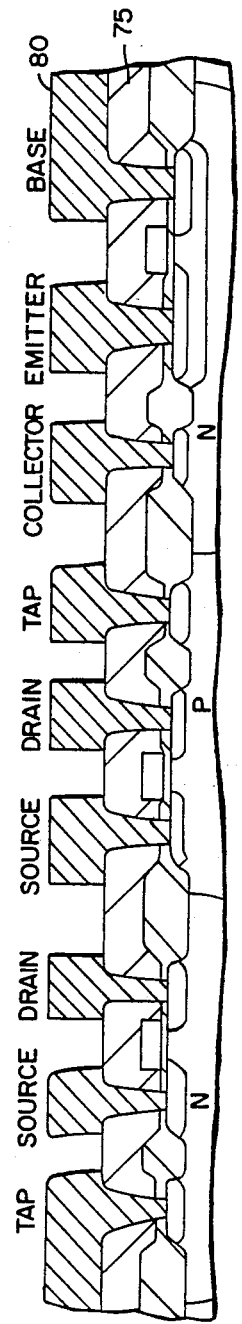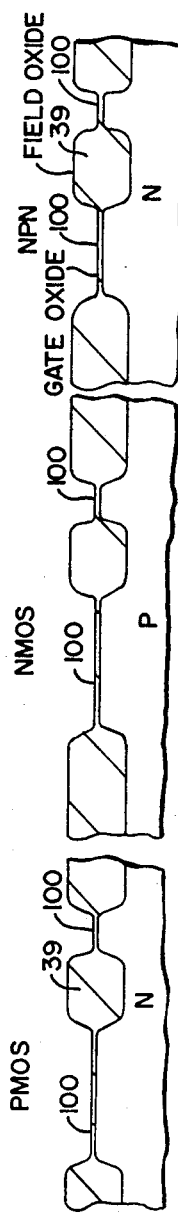

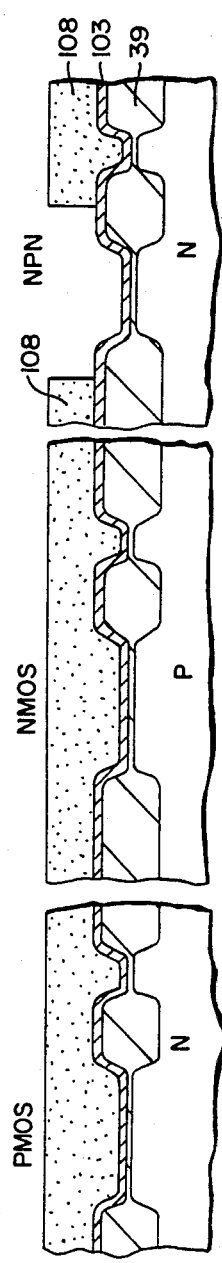
FIG._9.
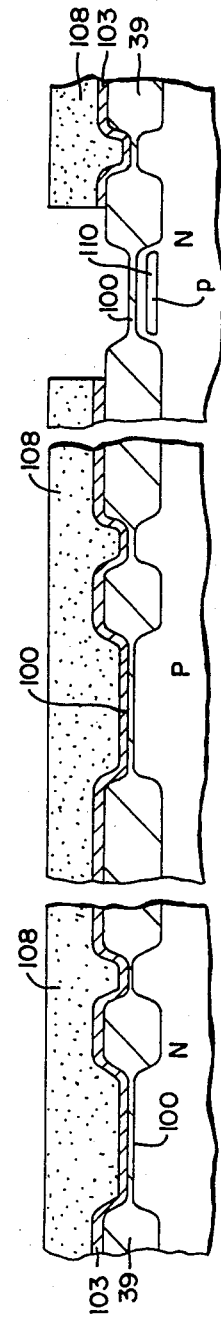
FIG._10.
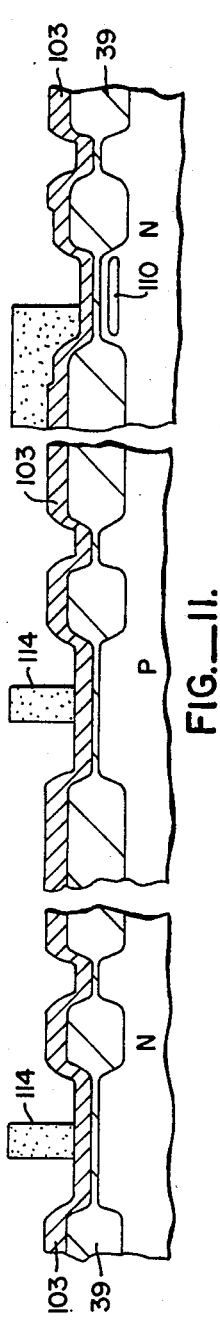
FIG._11.

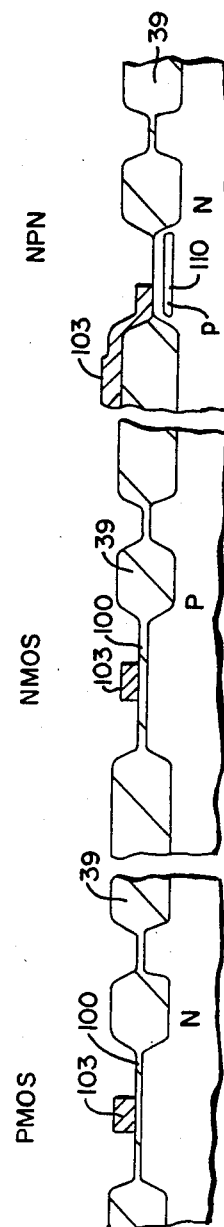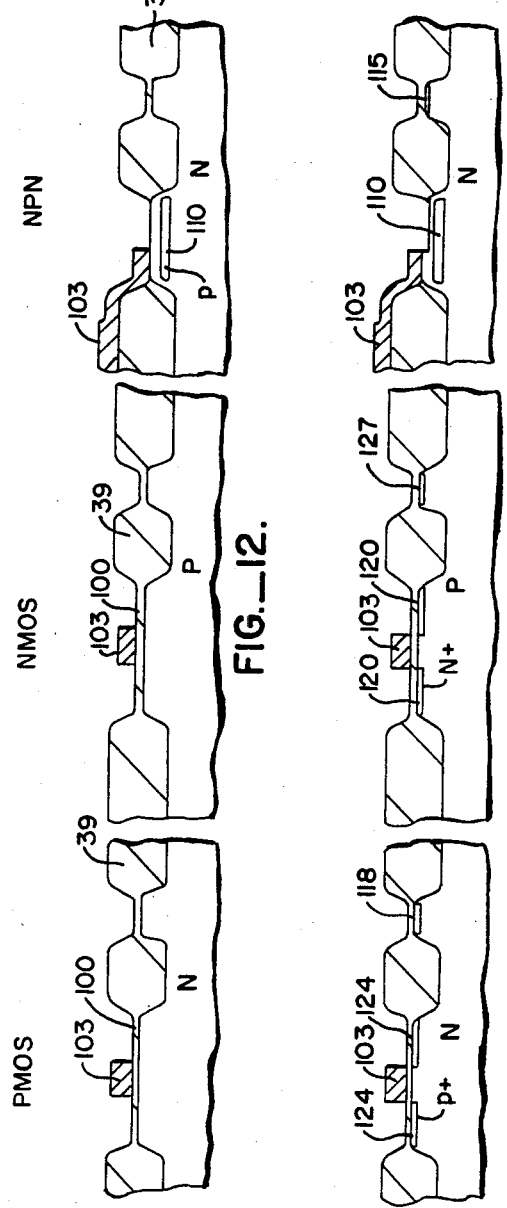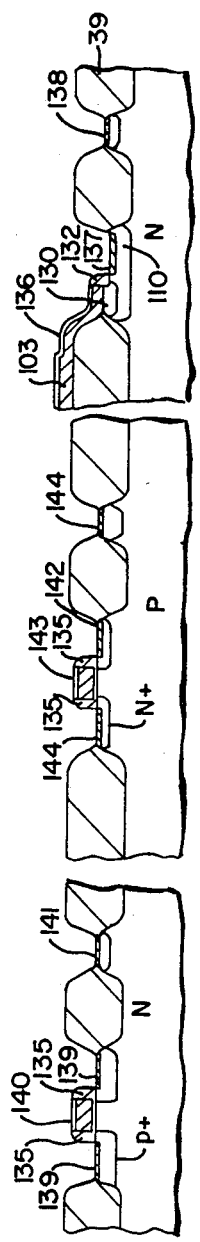
FIG.—12. FIG.—13. FIG.—14.

METHOD OF FABRICATING HIGH PERFORMANCE BICMOS STRUCTURES HAVING POLY EMITTERS AND SILICIDED BASES

BACKGROUND OF THE INVENTION

1. Field of the Invention

This invention relates to processes for manufacturing integrated circuits, and to a process for simultaneously fabricating bipolar and complementary field effect transistors in a semiconductor substrate. More particularly, the invention relates to the fabrication of such devices having lower base resistance and a polysilicon emitter, and to the fabrication of a completed BiCMOS structure having very high performance.

2. Description of the Prior Art

Bipolar and complementary metal oxide semiconductor (CMOS) technologies have each been independently understood for many years. The ability to combine CMOS with bipolar ("BiCMOS") on the same integrated circuit has raised new possibilities for very large scale integration. For example, bipolar output drivers may be employed with CMOS memories to provide more drive current. Because MOS slows down as temperature rises while bipolar speeds up, a CMOS bipolar combination may be employed to make devices less speed sensitive to temperature. Combining high performance bipolar devices with MOS transistors on the same integrated circuit allows a combination of the high-packing density of MOS devices with the high speed of bipolar and permits the integration of complex functions with high yields. The CMOS transistors with their inherently low powe requirements have large noise margins, while the bipolar devices have an advantage in switching speed and greater current drive per unit area.

Accordingly, much effort has been devoted by process scientists and engineers toward methods of integrating bipolar and CMOS processes on a single wafer. Unfortunately, to date the resulting BiCMOS processes are generally not optimized for either the CMOS or the bipolar aspect, consisting instead of a brute force combination of the steps required to fabricate each type device. The result is often a lengthy and complicated process using a large number of masking operations, which is vulnerable to lower yields as a result of the complexity of the process. Typical prior art bipolar-CMOS processes are found in U.S. Pat. Nos. 4,484,388 to Iwasaki; 4,507,847 to Sullivan; and 4,536,945 to Gray et al.

SUMMARY OF THE INVENTION

We have developed a process for fabricating both bipolar and CMOS devices which uses a minimal number of masking steps yet results in high performance bipolar and CMOS transistors. The process allows fabrication of CMOS devices with 1 micron gates, while providing bipolar devices switching at high speeds. In one version of our process, the bipolar devices operate at 8-to-10 gigaHertz. The resulting CMOS devices have high latch-up resistance and high packing density. (CMOS is used herein to refer to complementary field effect transistors regardless of whether their gates are metal or silicon.)

In a preferred embodiment, our method of fabricating a BiCMOS semiconductor structure on a first conductivity substrate begins with the formation of an opposite conductivity buried layer by the steps of introducing into at least one first region of the substrate a first impurity of N conductivity type, typically arsenic, and then introducing into the first region a second impurity of N conductivity type, typically phosphorus. Then, a blanket implantation of the substrate with P conductivity type impurity which will form the P buried layers beneath the P wells of the structure is performed. The P wells are used for fabrication of NMOS devices. An epitaxial layer is formed over the substrate, and parts of the epitaxial layer overlying the buried layers are doped with N conductivity type impurity. The structure is then heated to cause the N conductivity type impurity regions in the epitaxial layer and in the substrate to diffuse to contact each other. In the preferred embodiment this process results in the fabrication of buried layers which have low resistance, yet high diffusivity to lower the capacitance between the substrate and the buried layers. The process assures that the preferably N type buried layers join with the N conductivity type well formed in the epitaxial layer for the P channel MOS devices and NPN bipolar devices. Accurate control of the N well dopant and fabrication of the buried layers in a shorter time minimize the effects of prolonged high-temperature processing.

The method then includes the steps of forming an insulating layer over the surface of the silicon layer, and forming a conductive protective layer, typically polycrystalline silicon, over all of the insulating material. The insulating layer then is removed from the surface of the epitaxial silicon layer in the bipolar region and first conductivity type impurity is introduced into a part of the bipolar area to define the base. Additional conductive material is deposited over at least the bipolar region, and all of the protective layer is removed from the insulating layer except where gates and the emitter are desired. The sources and drains then are doped.

In the preferred embodiment, the initially formed insulating layer will provide the gate oxide, while the protective layer provides the polycrystalline silicon electrodes for the MOS devices. The single mask defines both the base of the bipolar devices and distinguishes the bipolar devices from the CMOS devices. Later in the process a single mask defines both the gates and the emitter for the structure. The protective layer not only serves as the gate electrodes, but also protects the gate oxide from the effect of subsequent processing to prevent the etching of openings in the gate oxide in places other than desired. The semiconductor structure from our process has a lower base resistance for the bipolar devices and is fabricated in a smaller area. The reduced area lowers the capacitance and increases the speed of the circuit. Forming the additional protective material adjacent the field oxide creates a walled emitter structure, while providing less sensitivity to alignment tolerances.

BRIEF DESCRIPTION OF THE DRAWINGS

FIG. 1 is a cross section of a semiconductor structure illustrating masking and doping of the substrate;

FIG. 2 is a cross section following formation of an epitaxial layer;

FIG. 3 is a cross section after formation of field oxide regions;

FIG. 4 is a cross section after gate oxidation;

FIG. 5 is a cross section after formation of polycrystalline silicon electrodes;

FIG. 6 is a cross section after formation of source and drain regions;

FIG. 7 is a cross section after formation of electrodes;

FIG. 8 illustrates the first step in an alternative process which may be employed following the formation of field oxide regions shown in FIG. 3;

FIG. 9 is a cross section after formation of a first layer of polycrystalline silicon;

FIG. 10 is a cross section after formation of the base of the NPN transistor;

FIG. 11 is a cross section after formation of additional polycrystalline silicon and a mask to define the MOS gates and bipolar emitter;

FIG. 12 is a cross section after formation of the gates and emitter;

FIG. 13 is a cross section after doping of the source and drain regions; and

FIG. 14 is a cross section after formation of a metal silicide interconnection layer.

DETAILED DESCRIPTION OF THE PREFERRED EMBODIMENTS

The embodiments of the process of our invention may be most readily understood by considering them as "front-end" and "back-end" processes. The front-end processes are used to form the semiconductor structure through the buried layers and epitaxial layer, while the back-end processes are used to complete the structure. As will be explained, a single front-end process may be combined with any one of a variety of back-end processes while a single back-end process may be combined with any one of a variety of front-end processes.

Front-End Process

FIG. 1 is a cross-sectional view of a semiconductor substrate 10 having a crystalline orientation of <100>, and which has been doped with P conductivity type impurity to a resistivity of 11-18 ohm centimeters. As an optional step after doping, the silicon substrate may be protected with a thin layer of silicon dioxide and alignment marks formed therein. This step may be eliminated if the later-formed buried layer regions are to be used for alignment.

Next, a mask is formed across the upper surface of substrate 10. Mask 15 typically will comprise photoresist, applied and defined using well known photolithographic or other techniques. Openings are made in mask 15 wherever an N conductivity type buried layer is desired. N type buried layers are desired wherever the P channel MOS devices and NPN bipolar devices will be formed. No N type buried layer is fabricated where N channel MOS devices are desired.

After completion of the mask, a first N conductivity type impurity is implanted, followed in the preferred embodiment by a second N conductivity type impurity implanted in the same region. The N type impurity dopants are shown as regions 18 in FIG. 1. In the preferred embodiment the first N type impurity is phosphorus introduced with a dosage of $3 \times 10^{13}$ to $3 \times 10^{14}$ atoms per square centimeter, while the second impurity is arsenic at a dosage of $1 \times 10^{15}$ to $1 \times 10^{16}$ atoms per square centimeter. The use of both dopants provides a substantial advantage over prior processes, while the arsenic lowers the resistance of the buried layer. The higher diffusivity of phosphorus allows it to diffuse further into the substrate (as well as into an overlying epitaxial layer), to lower the capacitance between the substrate and the buried layer in the bipolar devices. The double implant also assures that the N well implant in the epitaxial layer and in the buried layer join during subsequent thermal processing. This advantage is discussed further below Then, a blanket implant of P conductivity type impurity 12 is introduced across the entire surface of the substrate. This impurity ultimately will form a P conductivity type buried layer for the N channel CMOS transistors. By implanting the P impurity, rather than using a substrate previously doped, the doping concentration beneath the N type buried layers is minimized, lowering collector-substrate capacitance. In the preferred embodiment an upper portion 12 of substrate 10 is doped with $3 \times 10^{12}$ to $5 \times 10^{13}$ atoms per square centimeter of boron.

After doubly doping the substrate 10, epitaxial layer 21 is deposited across the silicon substrate 10 in the manner shown in FIG. 2. Preferably, epitaxial layer 21 is undoped, and about 1 to 2 microns thick. The formation of such epitaxial layers is well known. If desired, following formation of the epitaxial layer, a thin layer of protective silicon dioxide (not shown) is formed by oxidizing the upper surface of the epitaxial layer.

Next, an N well mask 24 is formed across the upper surface of the epitaxial layer (or silicon dioxide) to define the regions where N conductivity type wells are desired in the epitaxial layer. As shown in FIG. 2, such wells are desired for electrical isolation of the PMOS and NPN devices. Typically, the N well mask comprises photoresist, which may be patterned using the same mask as the N type buried layers. Alternatively, and as shown in FIG. 3 by the relative dimensions of the N-wells and buried layers, an oversize mask may be used. Following masking, the N conductivity type wells are implanted, preferably using phosphorus and a dose of $1–2 \times 10^{12}$ atoms per square centimeter.

The surface of the epitaxial layer 21 is again cleaned and reoxidized by heating it to a temperature of 900° C. for 30-60 minutes to form about 250-500 Angstroms of silicon dioxide 33 across the entire epitaxial layer 21. A layer of silicon nitride 35 approximately 1200-1700 Angstroms thick is deposited, preferably using chemical vapor deposition, across the surface of silicon dioxide 33. Using well known masking and etching techniques, silicon nitride layer 35 is removed from the surface of the silicon dioxide 33 wherever regions of field oxide 39 are desired. Typically, the field oxide is formed at the intersections of the N wells 27 and 28 with the P well 30. These regions of silicon dioxide are annular when viewed from above and serve to separate the N and P wells from each other at the surface. Additional regions of field oxide 39 are formed within the N and P wells themselves, for example, as shown in N well 28 for the NPN transistor, to allow a connection to the buried collector, which connection is isolated from the extrinsic base. In the other N well 27, the field oxide allows an isolated tap to the substrate, as it does in the P well 30.

Once the silicon nitride is suitably patterned, a field implant may be performed if desired. Such an implant assists in preventing channel inversion at the silicon dioxide-silicon interface resulting from impurity in the silicon dioxide field regions. In the preferred embodiment the field implant employs boron and a dose of $5 \times 10^{12}$ to $2 \times 10^{13}$ atoms per square centimeter. Unlike prior art processes, no mask is required for this implant. Our process uses the nitride layer 35 as the mask and later process steps compensate for the P type dopant beneath the field regions.

After the field implant, the structure is raised to a temperature of about 1050°–1100° C. for 1–2 hours in Nitrogen to diffuse the P and N conductivity type impurities employed to form the buried layers and wells. Then, the field is oxidized to create silicon dioxide regions 39. In the preferred embodiment such regions are approximately 6000 Angstroms thick formed by heating the structure to about 900° C. for 400 minutes. The appearance of the structure following this process is shown in FIG. 3. Note that the phosphorus has diffused up from the buried layer to contact the downwardly diffusing N well.

The BiCMOS process of our invention as thus far performed provides several unique advantages over prior art processes. The arsenic lowers the resistance of the buried layer 18, while the phosphorus lowers substrate/buried layer capacitance and assures that the N well implant 27 and buried layer 18 join during a relatively short thermal process. As a result, our process minimizes the exposure of the structure to prolonged high temperatures and the resulting degradation, while speeding manufacture of the circuit. Additionally, by employing an undoped silicon epitaxial layer, we allow accurate control of the P well dopant. The process allows minimizing the resistance of both the P and N wells, yet maintaining the doping concentrations thereof at a sufficiently low amount to minimize capacitance between the wells. High levels will lower performance of the bipolar devices and lower breakdown voltages for the CMOS devices. Our process prevents diffusion between the N and P wells to permit a closer spacing of those wells for denser CMOS structures.

At this stage in the process, any of several processes may be employed to complete the structure. One such process is depicted in FIGS. 4–7, while another process is depicted in FIGS. 8–14. The process shown in FIGS. 4–7 is described first.

First Back-End Process—Minimal Masks

Using suitable etchants, silicon nitride 35 and the thin layer of silicon dioxide 33 are stripped from the structure and a mask formed to define the NPN transistor base 40 shown in FIG. 4. One such mask is photoresist deposited to cover all of the surface of the structure except where the base 40 is desired. After masking, the base is implanted, preferably using boron and a dose of $1 \times 10^{13}$ to $5 \times 10^{13}$ atoms per square centimeter at 60–70 KeV followed by a dose of $1 \times 10^{13}$ to $1 \times 10^{14}$ atoms per square centimeter at 40–50 KeV. The high and low energy doses are employed to optimize base sheet resistance and gain of the bipolar transistor.

After formation of the NPN base 40, a voltage threshold implant adjusts the threshold of the CMOS devices. This implant is introduced by a blanket implantation into the bipolar, PMOS and NMOS regions. This step is also advantageous compared to prior art processes which required a masked threshold adjustment implant. In the preferred embodiment boron is employed with a dose of $1-2 \times 10^{12}$ atoms per square centimeter at 40 KeV. Then, the structure is heated in an oxidizing ambient to approximately 900° C. for 20–30 minutes to form a layer of silicon dioxide 43 about 200–250 Angstroms thick across the surface of the structure. Layer 43 is the gate insulator and as will be explained will separate the gate electrodes of the MOS devices from the substrate. The appearance of the structure at this stage of the process is shown in FIG. 4.

Next, a layer of polycrystalline silicon 45 approximately 3500 Angstroms thick is deposited by chemical vapor deposition across the entire surface of the structure, and then doped with prosphorus to improve its conductivity. Polycrystalline silicon layer 45 provides the gates of the complementary MOS devices and separates the base contact from the emitter in the vertical bipolar device. Using well known photolithographic techniques, a layer of photoresist 48 is deposited across the upper surface of the polysilicon 45 and patterned. Undesired polycrystalline silicon then is removed anisotropically from the surface of the structure to create a structure having the appearance shown in FIG. 5.

A mask is formed next to define the N conductivity type sources and drains of the NMOS devices as well as the emitter and collector contact of the bipolar device. This mask has openings over regions 50 in FIG. 6. Then N conductivity type impurity, preferably arsenic, is implanted through the openings in the mask with a dose of approximately $6 \times 10^{15}$ atoms per square centimeter at an energy of approximately 100 KeV. The implant forms a substrate tap 52 for the P channel device, source and drain regions 55 for the N channel device, and collector contact 58 and emitter 60 for the bipolar device. At the same time the gate electrode 62 of the N channel device is more strongly doped to lower its resistance.

Following the implant the structure is annealed by heating it to a temperature of 900° C. and then oxidized at 850° C. for 4 minutes. This will repair any defects in the crystal structure caused by the implantation, while simultaneously creating a differential oxide thickness. That is, the silicon dioxide layer 43 become thicker in those regions where exposed to N type impurity than elsewhere. Then a blanket P type implant is performed, preferably using boron difluoride at a dose of $3 \times 10^{15}$ atoms per square centimeter and an energy of 50 KeV. The energy of the implant is such that the boron atoms penetrate only the thin oxide regions, that is, those not previously formed over the N type impurity. Reliance upon the differential oxide thickness eliminates another mask as compared to the prior art. This implant provides the source and drain regions 68 of the P channel transistor, the substrate tap 70 of the N channel transistor, and a base contact 73 of the bipolar device. The implant is annealed by heating the structure to about 900° C. for 30 minutes. The appearance of the structure after annealing is depicted in FIG. 6.

After formation of the sources, drains, substrate taps and emitter as described above, a layer of silicon dioxide 75 is deposited across the upper surface of the structure using well known techniques. Typically, layer 75 is 5000 Angstroms thick and is not doped. Next, openings are formed in layer 75 to allow electrical connections to the sources, drains, emitter, collector, base, and substrate contacts. A metal layer 80 is deposited across the insulating layer 75 in contact with the desired regions. Again, using well known techniques, the metal layer is defined into individual electrical connections, as shown in FIG. 7. If desired, additional insulating material and additional layers of metal are formed to interconnect the components in the desired manner. The process described results in the fabrication of an integrated circuit having both bipolar and CMOS devices on a single substrate using a minimal number of masks.

Second Back-End Process—High Performance

We have also developed an alternate process for fabricating a BiCMOS structure which provides several unique advantages over other prior art processes. Although this process requires more masks than the one above, higher performance transistors result. Our alternate process is described in conjunction with FIGS. 8–14.

After the step of forming the field oxide described in conjunction with FIG. 3 is completed, the thin silicon dioxide layer 33 and silicon nitride layer 35 are removed from the surface of the structure. In their place, as shown in FIG. 8, a layer of gate oxide 100, on the order of 100–250 Angstroms in thickness, is formed by heating the substrate in an oxidizing ambient to a temperature of 900° C. for approximately 2–4 minutes.

Then, as shown in FIG. 9, a relatively thin layer of protective material, typically polycrystalline silicon 300–1000 Angstroms in thickness, is deposited across the entire surface of the structure. Polycrystalline silicon layer 103 is formed using a well known chemical vapor deposition processes. This first layer of polycrystalline silicon protects the gate oxide for the fabrication of subsequent MOS devices and prevents the etching of openings in the gate oxide in places other than where the gate oxide is to be removed.

A photoresist mask 108 is defined across the surface of the structure, and using well known techniques, an oversized opening is created where the base of the NPN transistor is to be formed. The exposed polysilicon 103 is etched away using well known techniques, and the bipolar base is implanted with boron, typically with a dose of on the order of $1 \times 10^{13}$ to $1 \times 10^{14}$ atoms per square centimeter at 40–100 KeV. As a result, base region 110 is formed beneath the thin oxide 100 in the manner depicted in FIG. 10. Using the same mask 108, the gate oxide is removed from the surface of the NPN transistor area.

Mask 108 then is removed, and as shown in FIG. 11, a layer of conductive material 103, also polycrystalline silicon, is deposited across the entire surface of the structure. Thus, in the regions where the polysilicon was previously removed (over the NPN base), layer 103 will be thinner than on other regions of the structure. Because the gate oxide was removed from the surface of the NPN device area, the polycrystalline silicon is deposited directly on the silicon in that region. Polysilicon layer 103 is then implanted with arsenic to lower its resistance. In the preferred embodiment, a dose of $1 \times 10^{15}$ to $1 \times 10^{16}$ atoms per square centimeter is used.

Next, and as also shown in FIG. 11, a new mask 114 is formed to protect regions where gates of the CMOS devices and a walled emitter of the bipolar device are desired. Thus, a single mask defines both the gates and the emitter.

Once the mask is completed, the exposed portions of polysilicon layer 103 are removed using well known chemical or plasma processes. The resulting structure is shown in FIG. 12. Where the polycrystalline silicon 103 has been formed on silicon dioxide 100, the silicon dioxide acts as an etch stop and prevent further etching In the bipolar device area, however, the absence of the gate oxide layer allows the etchant to attack the underlying silicon and results in a slight overetching of the epitaxial silicon, typically about 300–1000 Angstroms. This overetching results from the need to assure complete removal of the undesired polysilicon 103 from the CMOS device areas and the necessity therefore to extend the etching operation.

A layer of silicon dioxide (not shown) about 1000–3000 Angstroms thick then is formed across the upper surface of the exposed polysilicon by chemical vapor deposition or other known techniques. Using well known anisotropic etching processes, most of the silicon dioxide is etched from the surface of the structure to leave only oxidized sidewall spacer regions such as base contact spacer 132 and source/drain contact spacer regions 135. In the preferred embodiment such spacer regions will be about 1000–3000 Angstroms wide.

Another mask (not shown) is defined across the surface of the structure to protect regions of the epitaxial layer where N conductivity type impurity is not desired. These regions include the the bipolar device area, the sources and drains of the P channel device, and the substrate tap of the N channel device. Then, N conductivity type impurity is implanted through the mask openings. In the preferred embodiment a first dose of phosphorus of $1 \times 10^{13}$ to $1 \times 10^{14}$ atoms per square centimeter followed by a second dose of arsenic of $6 \times 10^{15}$ atoms per square centimeter at 100 KeV are employed. Two impurities are used to form a lightly doped drain type structure because the phosphorus will diffuse under the spacer oxide 135 toward the channel. The implant forms a collector contact 115 for the bipolar transistor, a substrate tap 118 for the P channel MOS device, and source/drain regions 120 for the N channel MOS device. In alternative embodiments, a first light dose of N type impurity is introduced before formation of the spacer regions and a second dose of N type impurity is introduced after formation of the spacer regions.

In a similar manner, another mask (not shown) is formed to protect the structure where P conductivity type impurity is not desired. Then a P type impurity implant, preferably boron at a dose of $3 \times 10^{15}$ atoms per square centimeter and an energy of 50 KeV, is employed to form the P type source and drain 124 of the P channel device and the substrate tap 127 of the N channel device. Importantly, because the NPN base and P channel source and drain are separately implanted, their performance may be independently optimized. Then, the P and N conductivity type implants are annealed by heating the structure to a temperature of 900° C. for 30–90 minutes. During annealing the impurity in the polysilicon contact 103 to the bipolar transistor will diffuse into the epitaxial silicon to form the emitter 130.

Optionally, an extrinsic base region implant to lower the base resistance may be performed at this stage of the process by masking all of the structure except for the base region and then introducing additional impurity. If this step is performed, a dose of $5 \times 10^{14}$ to $2 \times 10^{15}$ atoms per square centimeter of boron is employed. The spacer 132 prevents the implant from being placed too close to the emitter.

Next, thin layer of silicide forming metal is deposited across the upper surface of the structure and the structured heated to cause the metal to react with the underlying silicon, both polycrystalline and monocrystalline, to form regions of metal silicide. Unreacted metal then is removed selectively by a wet chemical etch. Any metal which will react with silicon to form a silicide may be employed; however, in the preferred embodiment, approximately 500–1000 Angstroms of platinum are sputtered onto the surface and the structure heated to 400°–450° C. for 5–30 minutes to form platinum silicide. Platinum silicide forms excellent contacts to P type regions. Silicide region 136 is an electrical contact via polycrystalline silicon 103 to emitter 130 (as well as to any other component such as a nearby resistor formed on field oxide 39), while silicide region 137 is a contact to base region 110. The collector contact is silicide contact 138. In the P channel device, silicide regions 139 provide source/drain contacts, while silicide 140 contacts the gate, and silicide 141 is a substrate tap. Similarly, with respect to the N channel device, silicide 142 contacts the source/drain regions, while silicide 143 contacts the gate, and silicide 144 connects to the substrate tap. The appearance of the structure after formation of the silicide is depicted in FIG. 14.

At this stage of the process, the structure may be completed by fabrication of metal connections using conventional techniques, for example, as described above in conjunction with FIG. 7.

The process of our invention provides many advantages over prior art processes. A single mask is used to distinguish the bipolar devices from the CMOS devices, that is, the base mask. Only a single mask is necessary to define both the gates and the emitter. Furthermore, the first layer of polycrystalline silicon protects the gate oxide for subsequent MOS devices.

Although preferred embodiments of the processes of our invention have been described above, these embodiments are intended to illustrate the invention rather than limit it. The scope of the invention may be determined from the following claims.

We claim:

1. A method of fabricating a semiconductor structure in a silicon layer having an upper surface and having a first region of first conductivity type and second and third regions of second conductivity type, the first, second and third regions being separated at the surface from each other by field regions of insulating material inset into the layer, the method comprising:
   forming an insulating layer over the surface of the silicon layer,
   forming a protective layer of conductive material over all of the insulating layer except a first portion of the third region;
   introducing first conductivity type impurity into the first portion of the third region;
   using the protective layer as a mask removing the insulating layer from the surface of the silicon layer in the first portion of the third region;
   depositing additional conductive material over at least the first portion of the third region;
   removing the protective layer from the insulating layer except a first portion of the first region, a first portion of the second region and a second portion of the third region, the first portion of each of the first and second regions being spaced apart from the field regions; and
   introducing first conductivity type impurity into the second region except where overlaid by the protective layer, and second conductivity type impurity into the first region except where overlaid by the protective layer wherein an NMOS device is formed in the first region, a PMOS device is formed in the second region, and a bipolar device is formed in the third region.

2. A method as in claim 1 further comprising, following the step of depositing additional protective material, the step of doping the additional protective material to lower its resistance.

3. A method as in claim 2 further comprising, following the step of removing the protective layer, the step of heating the structure to cause some of the impurity in the conductive material to diffuse into the third region.

4. A method as in claim 1 wherein the step of forming an insulating layer comprises oxidizing the silicon layer.

5. A method as in claim 1 wherein the step of forming a protective layer comprises forming a layer of polycrystalline silicon.

6. A method as in claim 5 wherein the step of depositing additional conductive material comprises depositing additional polycrystalline silicon.

7. A method as in claim 5 wherein the step of forming a protective layer comprises depositing a protective layer over all of the structure, and then removing the protective layer from the first portion of the third region.

8. A method as in claim 1 wherein the step of forming an insulating layer provides a layer of insulating material to separate at least one gate electrode from the underlying substrate.

9. A method as in claim 8 wherein the step of forming a protective layer comprises forming a gate electrode.

10. A method as in claim 9 wherein the step of introducing first conductivity type impurity into the first portion of the third region comprises forming a base of the bipolar device.

11. A method as in claim 9 wherein the step of introducing first conductivity type impurity into the second region and second conductivity type impurity into the first region comprises doping sources and drains of the CMOS devices.

12. A method of fabricating a semiconductor structure in a silicon layer having an upper surface and having a first region of first conductivity type and second and third regions of second conductivity type, the first, second and third regions being separated at the surface from each other by field regions of silicon dioxide inset into the layer, the method comprising:
   forming a gate insulating layer of silicon dioxide over the surface of the silicon layer;
   forming a layer of polycrystalline silicon over all of the gate insulating layer except a first portion of the third region where a base of a bipolar transistor is desired;
   introducing first conductivity type impurity into the first portion of the third region to define the base;
   using the polycrystalline silicon as a mask removing the gate insulating layer from the surface of the silicon layer in the first portion of the third region;
   depositing additional polycrystalline silicon over the first portion of the third region and over the layer of polycrystalline silicon;
   removing the polycrystalline silicon from the insulating layer except a first portion of the first region to define a gate electrode, a first portion of the second region to define another gate electrode and a second portion of the third region to define an emitter contact, the gate electrodes of each of the first and second regions being spaced apart from the field regions; and
   introducing first conductivity type impurity into the second region except where overlaid by the protective layer to define a source and a drain, and second conductivity type impurity into the first region except where overlaid by the protective layer to define another source and drain.

13. A method as in claim 1 wherein the silicon layer having an upper surface and having a first region of first conductivity type and second and third regions of second conductivity type, the first, second and third regions being separated at the surface from each other by field regions of insulating material inset into the layer is formed by a method comprising:

introducing a first impurity of second conductivity type into at least one first region of the substrate;

introducing a second impurity of second conductivity type into the first region;

forming an epitaxial layer over the substrate;

introducing second conductivity type impurity into at least one first region of the epitaxial layer overlying the first region of the substrate; and heating the structure to cause the second conductivity type impurity in the epitaxial layer and in the substrate to diffuse to contact each other.

14. A method as in claim 13 wherein the step of introducing second conductivity type impurity into at least one first region of the epitaxial layer comprises introducing second conductivity type impurity into a pair of spaced-apart first regions of the epitaxial layer to define a first and a second well, the pair of first regions being separated by an intervening region of the epitaxial layer of opposite conductivity type to define a third well.

15. A method as in claim 14 followed by the step of forming a layer of insulating material across the epitaxial layer.

16. A method as in claim 15 followed by the step of forming a protective layer of protective material over all of the insulating material except a first portion of the first well.

17. A method as in claim 16 followed by the step of introducing first conductivity type impurity into the first well through the first portion.

18. A method as in claim 17 followed by the steps of removing the insulating material from the first portion of the first well and forming additional protective material over at least the first portion of the first well.

19. A method as in claim 18 followed by the step of removing all of the protective material from the surface of the structure except for a second portion of the first well, a first portion of the second well, and a first portion of the third well.

20. A method as in claim 19 followed by the step of introducing first conductivity type impurity into two regions of the epitaxial layer spaced apart by the first portion of the second well and introducing second conductivity type impurity into two regions of the epitaxial layer spaced apart by the first portion of the third well.

21. A method as in claim 20 followed by the step of forming electrical connections to each of the wells.

* * * * *